May 30, 1967 J. R. GANZEL ETAL 3,323,062
SIGNAL MIXING CIRCUIT INCLUDING VARACTOR DIODE
Filed Nov. 12, 1963
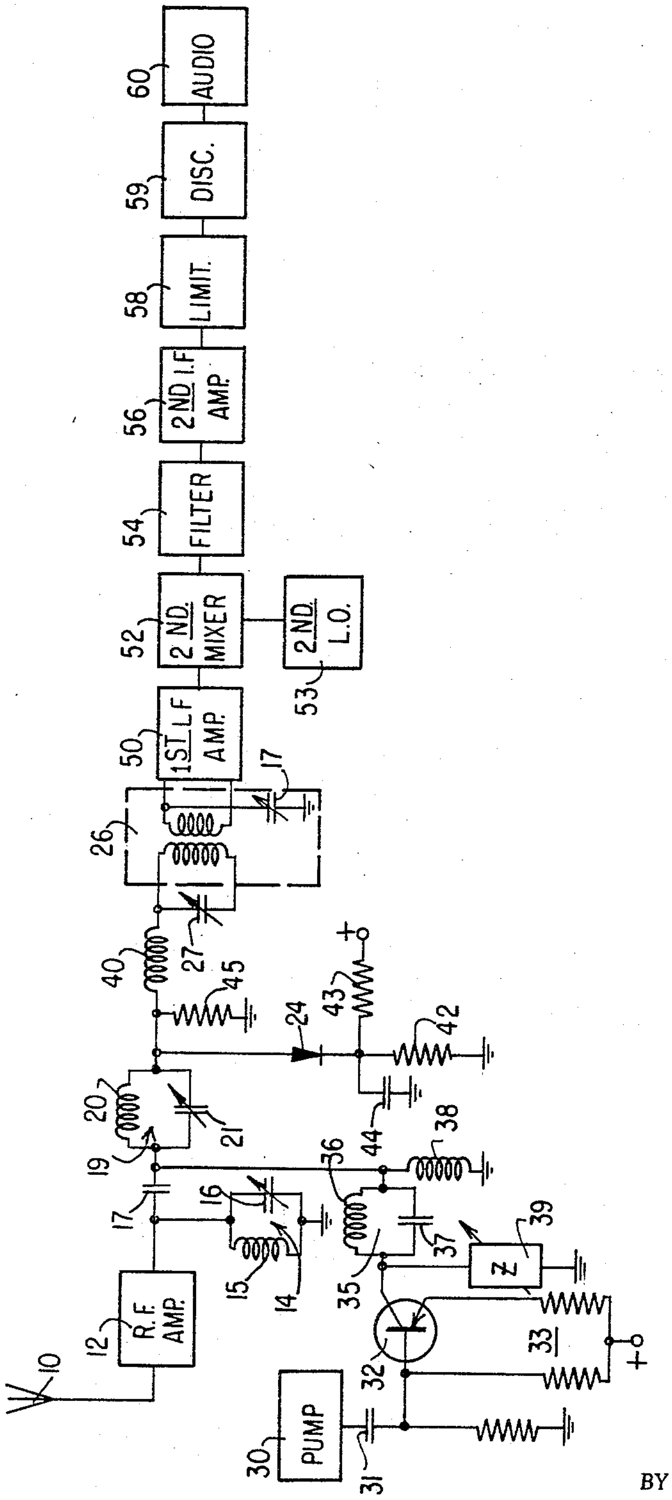
INVENTORS
Joseph R. Ganzel
BY Charles N. Lynk, Jr.
Mueller & Aichele
Attys.

United States Patent Office 3,323,062

Patented May 30, 1967

3,323,062

SIGNAL MIXING CIRCUIT INCLUDING VARACTOR DIODE

Joseph R. Ganzel, Elmhurst, and Charles N. Lynk, Jr., Chicago, Ill., assignors to Motorola, Inc., Chicago, Ill., a corporation of Illinois Filed Nov. 12, 1963, Ser. No. 322,854

8 Claims. (Cl. 325—449)

The present invention relates to signal conversion systems and more particularly to an improved signal converting circuit for communication receivers.

Although it has long been known to utilize the non-linear characteristics of crystal diodes (such as point contact germanium and silicon diodes) to provide signal mixing at high frequencies, such devices have a limited dynamic range, produce a relatively high noise level, and offer limited intermodulation protection for communications receivers operating in the VHF and UHF ranges.

There have been recent developments in the use of the voltage dependent capacitance of reverse biased PN junction diodes to perform many signal conversion and amplification functions. In particular, the application of two high frequency signals to tuned circuits having a semiconductor diode of the type known as a varactor diode as a common reactance element and coupled with a circuit tuned to a third frequency which is either the sum or the difference of the applied frequencies, has resulted in the development of parametric amplifiers and parametric converters. In this context a parameter of the reactance element (i.e., the capacitance of a varactor diode) is varied by one of the applied signals, usually termed a pumping signal, to cause amplification and/or frequency conversion of the other applied signal, which is usually an input signal. Parametric converters of this type have been used to a limited extent, particularly at microwave frequencies, to replace crystal diodes for frequency conversion. For example, when converting to higher frequencies gain is provided that is proportional to the ratio of output to input frequency (up-conversion). Thus, it is possible to take advantage of the low noise figure of parametric converters to provide low-level gain for an improved front-end noise figure in high frequency receivers. It is still necessary, however, to use conventional mixers at subsequent high level stages to mix down to the desired intermediate frequency.

Communications receivers utilizing signal mixing to convert signals of an incoming carrier frequency to a lower intermediate frequency are subject to spurious responses as a result of unwanted intermodulation products appearing in the output of the mixing stage. Carrier wave signals at frequencies differing from but close to the wanted incoming signals are passed through the antenna and RF amplifier tuned circuits to be mixed with the local oscillator signal. Since any active non-linear circuit element can produce an infinite number of harmonics, signals of unwanted frequencies may be mixed with the local oscillator signal to produce a large number of intermodulation products, some of which may fall within the passband of the IF stages of the receiver. In many instances it is necessary to add RF tuning to reduce spurious responses to an acceptable level. It is therefore desirable to utilize an active mixing element which may be operated over a non-linear region which minimizes signal components caused by intermodulation of unwanted frequencies.

It has been found that the use of a varactor diode as a parametric down-converter for signal mixing in a communications receiver results in improved receiver performance in terms of intermodulation characteristics and spurious response protection. Varactor diodes have a larger dynamic range than point contact diodes and accordingly higher level pumping (or local oscillator) signals may be applied, thereby providing improved intermodulation characteristics, and when this improvement is utilized in conjunction with a properly selected IF frequency greater spurious response protection is possible. And, as previously mentioned, such devices operate at lower noise level than crystal mixers to provide an improved signal-to-noise ratio in the early stages of the receiver.

However, for practical operation of a parametric converter in a commercial communications receiver it is necessary to provide circuit isolation of the input, output and pump frequency signal paths to prevent interaction and to minimize noise in the IF stages of the receiver, particularly in instances where the IF frequency is close to the pump or local oscillator frequency, a circumstance desirable for minimum conversion loss. And with systems designed to operate in the VHF and UHF frequency ranges, where it is convenient, if not necessary, to use lumped parameter rather than distributed parameter tuned circuits and signal traps, it is necessary to avoid an increase in circuit complexity which introduces losses and noise sources that tend to mask the advantages inherent in the use of varactor diodes as parametric converters.

It is therefore an object of the present invention to provide an improved mixer circuit for communication receivers, which circuit utilizes a varactor diode as the active circuit element thereof.

A further object is to provide a parametric down-converter of simplified circuit configuration for use as a mixer in communications receivers in the VHF and UHF frequency regions.

Another object of the invention is to provide a communication receiver with an improved mixer circuit having an increased dynamic range for improved intermodulation characteristics to enhance spurious response protection in the receiver.

A feature of the invention is the provision of a communications receiver with a mixer circuit which includes a varactor diode and circuit means to apply a received carrier wave signal and a pumping signal thereto, and circuit means to derive a signal of a lower frequency therefrom for use as an intermediate frequency in the receiver.

A further feature is the provision of a parametric down-converter as a mixer circuit in a communications receiver, with improved and simplified circuit means for isolation of the carrier wave signal, the pumping signal source and the output signal so that the occurrance of noise and unwanted frequency components is minimized in the intermediate frequency portion of the receiver.

Still another feature of the invention is the provision of a mixer circuit of the above described type, with means for biasing the varactor diode for optimum intermodulation protection in the receiver and means for stabilizing the diode so that it may be used either as an upper or lower sideband down-converter.

Further objects, features and advantages of the invention will become apparent from the following description when taken in conjunction with the accompanying drawing, which is a diagram partly in schematic and partly in block form illustrating a communications receiver embodying the invention.

In practicing the invention, a parametric down-converter utilizing a varactor diode and operative to convert a received carrier wave signal to a lower intermediate frequency signal is provided to function as a mixer in a communications receiver. It is to be understood that throughout the specification and in the claims, the term "varactor diode" refers to a PN junction semiconductor device having a specified non-linear charge-voltage characteristics, particularly adapted for low loss operation in the VHF and above frequency ranges. And while down-conversion is provided, the circuit may take the form of an upper sideband down-converter, wherein the pump frequency is between the carrier wave and the IF frequency, or a lower sideband down-converter, wherein the pump frequency is above the received carrier wave frequency.

The carrier wave signal and a pumping (or local oscillator) signal are both applied to the varactor diode and a signal having the frequency which is the difference between the carrier wave signal and the pumping signal is derived therefrom to be coupled to the IF stages of the receiver. Tuned circuits and signal traps associated with each signal loop eliminates frequency components except those of wanted frequencies from the varactor diode to reduce unnecessary power dissipation and to prevent interaction with the pumping source. An adjustable biasing potential coupled to the other electrode reverse biases the diode to allow operation over a selected region of its non-linear voltage-capacitance curve, and a stabilizing resistor may be coupled across the varactor diode to allow the circuit to function either as an upper or lower sideband down-converter.

A parametric down-converter results in a conversion loss which is proportional to the ratio of output to input frequency. Thus, to minimize this loss the separation of RF and IF signal frequency is chosen to be less than that considered optimum for conventional crystal diode mixers. A sharply tuned filter, such as a crystal filter, selects the IF frequency at the output of the parametric down-converter. This effectively isolates the conversion stage to prevent intermodulation in subsequent stages of the receiver, allowing the improved intermodulation characteristics and noise figure of the parametric down-converter to be fully realized in the early low-level stages of the receiver. Accordingly, simplified RF stages may be utilized, and complex, highly selective tunable RF filters are not needed.

Referring now to FIG. 1, there is illustrated a frequency modulated receiver of the double conversion type incorporating the parametric signal converter of the invention. It is to be understood, however, that the invention is not limited to a particular type of receiver. Signals of carrier wave frequency are received at antenna 10 and coupled to tuned RF amplifier stage 12. A parallel resonant circuit 14, including inductor 15 and capacitor 16, is coupled between the output of RF amplifier stage 12 and ground reference potential. Resonant circuit 14 is tuned to the frequency of the carrier wave signal and provides the input signal for the mixer. Signals of carrier wave frequency appearing across resonant circuit 14 are fed through capacitor 17 and wave trap 19, which includes inductor 20 and capacitor 21, to one electrode of varactor diode 24. The intermediate frequency signal derived as hereinafter described is then supplied through inductor 40 to crystal filter 26, which selectively rejects the carrier wave signal and the pumping signal and couples a signal of intermediate frequency to the IF stages of the receiver. The output of crystal filter 26 is supplied to first IF amplifier stage 50 and then to second mixer 52 where it is further mixed with a signal from second local oscillator 53 to provide a second intermediate frequency signal, which is typically 455 kc. This second intermediate frequency signal is then filtered by filter 54, amplified by IF amplifier 56 and supplied through limiter 58 to discriminator 59. The second IF signal is therein detected in the conventional manner to provide an audio signal to be coupled to audio output stage 60.

As previously mentioned, the carrier wave signal and a pumping signal are applied to varactor diode 24 to be converted to a desired intermediate frequency signal. By way of example, although not limiting, in the double conversion type receiver shown the carrier wave signal may be in the frequency range of 25–54 megacycles while the first intermediate ferquency signal has a frequency of 12 megacycles.

A pumping or local oscillator signal is derived from source 30, which may conveniently be a stabilized crystal controlled oscillator operating within a specified frequency range. By operating selected crystals at specified low frequencies and utilizing known frequency multiplication techniques, the desired frequency range of the pumping signal is achieved. The output of pumping signal source 30 is coupled by capacitor 31 to the input base electrode of amplifying transistor 32. The amplified pumping signal appearing at the collector electrode of transistor 32 is coupled through wave trap 35, including inductor 36 and capacitor 37, to the junction point of capacitor 17 and wave trap 19. Thus, the pumping signal is supplied through wave trap 19 to the same electrode of varactor diode 24 as is the input carrier wave signal. The wave trap 35 is tuned to anti-resonance with the carrier wave signal and presents a high impedance at carrier frequency to prevent intermodulation in the collector circuit of transistor 32.

Inductor 38 connects the end of wave trap 35 common with wave trap 19 to ground reference potential, while impedance 39 connects the end of wave trap 35 common with the collector electrode of transistor 32 to ground reference potential. Impedance 39 may be either an inductor or a capacitor and combines with inductor 38 to be resonant with the junction capacitance of varactor diode 24 at the frequency of the pumping signal. Since wave traps 19 and 35 are essentially short circuits at this frequency, inductor 38, impedance 39 and the capacitance of the junction of varactor diode 24 form a parallel resonant circuit, tuned to the frequency of the pumping signal, in which varactor diode 24 is included as one element thereof.

Anti-resonant wave trap 19 tunes with the capacitance of varactor diode 24 to provide a high impedance to the intermediate frequency signals produced by the down-conversion of the carrier wave signal. Inductor 40 further provides a high impedance to both the carrier wave signal frequency and the pumping signal frequency to reject such signals from the IF stages of the receiver. Thus, signals of these two frequencies are prevented from entering the input of crystal filter 26, which is tuned to the IF or the output frequency of the down-converter circuit. The input to filter 26 is tuned by capacitor 27, connected in shunt therewith. Preferably filter 26 is a crystal filter of a known type, employing one or more quartz crystals for high selectivity. This effectively prevents all signals except the selected IF signal from subsequent stages of the receiver.

Bias for varactor diode 24 is provided by a voltage divider including resistors 42 and 43, coupled to a suitable source of positive potential. Capacitor 44 bypasses resistor 42 to provide a low impedance return to ground reference potential for high frequency signal components appearing across varactor diode 24. Selection of the voltage division ratio between resistors 42 and 43 provide a biasing potential at the junction point thereof to bias varactor diode 24 to a desired operating point on its capacitance vs. voltage characteristic curve.

In instances where the frequency of the pumping signal is higher than the frequency of the received carrier wave signal, as is the typical case for lower sideband down-conversion, the parametric circuit tends to become unstable. Such instability is inherent in parametric circuits and arises from the fact that the reactance element tends to appear as a negative resistance under certain operating conditions. Stability may be enhanced by shunting the input terminal of varactor diode 24 with resistor 45. In the instance of upper sideband down-conversion, where the carrier signal frequency is greater than the frequency of the pumping signal the circuit is inherently stable and stabilizing resistor 45 is not necessary.

In operation a received carrier wave signal developed across resonant circuit 14 is coupled to varactor diode 24, as is a pumping signal from pump source 30. The signal path for the carrier wave signal is through capacitor 17, wave trap 19, varactor diode 24 and capacitor 44 to ground reference potential. The parallel resonant circuit 14 provides an input tuned circuit at this frequency. The pumping signal path is coupled from the output collector electrode of transistor 32 through wave trap 35 and wave trap 19, varactor diode 24 and capacitor 44 to ground reference potential. Thus, varactor diode provides a common reactance element for these two signal paths. Inductor 38 and impedance 39 are further tuned with the capacitance of the varactor diode 24 to be resonant at the frequency of the pumping signal. Interaction caused by the variable reactance of diode 24, coupled in common in the carrier wave and the pumping signal paths, provides frequency conversion of the incoming carrier wave signal to an intermediate frequency signal which is selected by crystal filter 26 and coupled to the first IF amplifier stage 50 of the receiver. Wave trap 19 provides anti-resonant at the intermediate frequency to prevent it from being fed back to the RF stages and into the pumping circuit, while wave trap 35 further prevents the RF signal from being fed back into the collector circuit of transistor 32.

By providing a pumping frequency which is greater than the carrier wave frequency, lower sideband down-conversion is achieved. When the pumping frequency is less than the carrier wave frequency, upper sideband down-conversion is achieved. Since for down-conversion there is a net conversion loss which is proportional to the ratio of the input to output frequencies, it is desirable to maintain the output intermediate frequency as high as possible, and for receivers operating in the 25–50 mc. range may be in the order of 12 mc. The provision of a stabilizing resistor across the varactor diode enables the circuit to function as either an upper or lower sideband down-converter. Band switching may conveniently be provided by ganging the wave traps and resonant circuits with the frequency multipliers of pump source 30, as is a known practice in conventional mixers employing a local oscillator. Fine tuning of the receiver within a selected band may be accomplished by tracking of the tuning elements in the known manner.

It can be shown that unwanted intermodulation components arising from higher order coefficients of a power series expansion expressing the performance of an active non-linear functioning as a mixer can be minimized by increasing the level of signals applied to it without substantially reducing wanted signal components. Since a varactor diode has a larger dynamic range than a conventional crystal mixer, the advantage of this effect can be realized by using a parametric down-converter for signal conversion in the receiver. Accordingly, for a given non-linear operating region as determined by the bias applied to varactor diode 24, the level of the pumping signal can be selected high enough for optimum intermodulation performance.

In a receiver embodying the circuit of FIG. 1, a PSI V-20 varactor diode was used. The receiver was tunable from 25–54 mc., and filter 26 of the first IF stage was tuned to 12 mc. A 9 volt bias was applied to diode 24, and a 50 to 80 mw. pumping signal was used, tunable between 37 and 64 mc. for lower sideband down-conversion. Since the varactor diode draws no forward current, this results in a 5–6 volt pumping signal level. Measured spurious responses in the receiver output were down approximately 80 db from maximum signal level.

The invention provides therefore an improved signal conversion circuit for use with communications receivers. By utilization of a varactor diode as a parametric down-converter, it is possible to provide a mixer which has large dynamic range, resulting in improved signal-to-noise ratio, intermodulation characteristics and spurious response protection as compared with conventional crystal mixers.

We claim:

1. A frequency conversion circuit for use in a superheterodyne receiver having carrier wave signal translating means and intermediate frequency signal translating means, said frequency conversion circuit including in combination, first tuned circuit means for developing a carrier wave signal of a first frequency, a PN junction diode having first and second electrodes, a first anti-resonant filter tunable with the junction capacitance of said diode to reject signals of said intermediate frequency, means coupling the output of said first tuned circuit means to a first terminal of said first anti-resonant filter, means coupling a second terminal of said first anti-resonant filter to said first diode electrode, oscillator means for providing a signal of a second frequency, a second anti-resonant filter tuned to reject said carrier wave signal, means coupling the output of said oscillator means to a first terminal of said second anti-resonant filter, means connecting a second terminal of said second anti-resonant filter to the first terminal of said first anti-resonant filter, circuit means coupling said second diode electrode to a reference poten-tween said second anti-resonant filter and ground refer-tance of said diode at said second frequency coupled between said second anti-resonant filter and ground reference potential, and highly selective filter means for coupling the first electrode of said diode to the intermediate frequency signal translating means of the receiver.

2. A frequency conversion circuit for use in superheterodyne receiver adapted to receive a carrier wave signal and which includes a local oscillator and an intermediate frequency stage tuned to a frequency representing the difference frequency between the carrier wave signal and the frequency of the local oscillator, said frequency conversion circuit including in combination, first tuned circuit means for providing a carrier wave signal of a first frequency, a PN junction diode having first and second electrodes, a first anti-resonant filter tunable with the junction capcitance of said diode to reject said intermediate frequency signal, means for coupling the output of said first tuned circuit means to a first terminal of said first anti-resonant filter, means coupling a second terminal of said first anti-resonant filter to said first diode electrode, a second anti-resonant filter tuned to reject said carrier wave signal, means coupling the output of the local oscillator to a first terminal of said second anti-resonant filter, means connecting a second terminal of said second anti-resonant filter to the first terminal of said first anti-resonant filter, circuit means coupling said second diode electrode to a reference potential, inductor means coupling the second terminal of said second anti-resonant filter to a reference potential, reactance means coupling the first terminal of said second anti-resonant filter to a reference potential, with said inductor means and said reactance means resonant with the junction capacitance of said diode at the oscillator frequency, and circuit means for coupling said first diode electrode to the intermediate frequency stage of the receiver.

3. A frequency conversion circuit for use in a superheterodyne receiver for translating the frequency of a received carrier wave signal to an intermediate frequency signal, said frequency conversion circuit including in combination, first tuned circuit means for providing a carrier wave signal of a first frequency, a PN junction diode having first and second electrodes, a first anti-resonant filter tunable with the junction capacitance of said diode to reject said intermediate frequency signals, means for coupling the output of said first tuned circuit means to a first terminal of said first anti-resonant filter, means coupling a second terminal of said first anti-resonant filter to said first diode electrode, means for providing a signal of a second frequency, a second anti-resonant filter tuned to reject said carrier wave signal, means coupling said second frequency signal to a first terminal of said second anti-resonant filter, means connecting a second terminal of said second anti-resonant filter to the first terminal of said first anti-resonant filter, first resistance means connected between said first diode electrode and a reference potential, second resistance means bypassed by capacitor means connecting said second diode electrode to said reference potential, means for supplying a biasing voltage to said second diode electrode, first reactance means coupling the first terminal of said second anti-resonant filter to said reference potential, second reactance means coupling the second terminal of said second anti-resonance filter to said reference potential, with said first and second reactance means tuned to resonate with the junction capacitance of said diode at said second frequency, intermediate frequency stage tuned to a frequency representing the difference frequency between said carrier wave signal and said second frequency signal, and circuit means for coupling said first diode electrode to said intermediate frequency stage of the receiver to thereby provide an intermediate frequency signal for said receiver.

4. A circuit for converting signals of first and second frequencies to a signal of a third frequency, which third frequency is the difference between said first and second frequencies, including in combination, a PN junction diode having first and second electrodes, which diode is characterized by a junction capacitance which varies in a non-linear manner in response to signals applied to a first electrode thereof, means coupling said second diode electrode to a reference potential, means for connecting a biasing voltage to said second diode electrode, first anti-resonant filter means having first and second terminals, said first anti-resonant filter means tunable with the junction capacitance of said diode to reject signals of said third frequency, means for coupling signals of said first frequency to the first terminal of said first anti-resonant filter means, means connecting the second terminal of said first anti-resonant filter means to said first diode electrode, second anti-resonant filter means having first and second terminals and tuned to reject signals of said first frequency, means for providing a signal of said second frequency, means coupling said second frequency signal to the first terminal of said second anti-resonant filter means, means connecting the second terminal of said second anti-resonant filter means to the first terminal of said first anti-resonant filter means, reactance means coupling the first terminal of said second anti-resonant filter means to a reference potential, inductor means coupling the second terminal of said first anti-resonant filter means to said reference potential, with said reactance means and said inductor means resonant with the junction capacitance of said diode at said second frequency, pass band filter means tuned to said third frequency, and means presenting a high impedance to signals of said first and second frequencies coupling said first diode electrode to said pass band filter means.

5. A circuit for converting signals of first and second frequencies to a signal of a third frequency, which third frequency is the difference between said first and second frequencies, including in combination, a PN junction diode having first and second electrodes, which diode is characterized by a junction capacitance which varies in a non-linear manner in response to signals applied to a first electrode thereof, first anti-resonant filter means having first and second terminals, said first filter means tunable with the junction capacitance of said diode to reject signals of said third frequency, means for coupling signals of said first frequency to the first terminal of said first anti-resonant filter means, means connecting the second terminal of said first anti-resonant filter means to said first diode electrode, second anti-resonant filter means having first and second terminals and tuned to reject signals of said first frequency, oscillator means for providing signals of said second frequency, amplifier means coupling the output of said oscillator means to the first terminal of said second anti-resonant filter means, means connecting the second terminal of said second anti-resonant filter means to the first terminal of said first anti-resonant filter means, reactance means coupling the first terminal of said second anti-resonant filter means to a reference potential, inductor means coupling the second terminal of said second anti-resonant filter means to said reference potential, with said reactance means and said inductor means resonant with the junction capacitance of said diode at said second frequency, first resistance means connecting said first diode electrode to ground reference potential, second resistance means bypassed by capacitor means coupling said second diode electrode to said reference potential, means for connecting a biasing voltage to said second diode electrode, pass band filter means tuned to said third frequency, and means presenting a high impedance to signals of said first and second frequencies coupling said first diode electrode to said pass band filter means.

6. A parametric converter for combining an input signal of a first frequency with a pump signal of a second frequency to provide a signal of a third frequency, which third frequency is the difference between said pump signal frequency and said input signal frequency, said converter including in combination, a varactor diode having first and second electrodes, first anti-resonant filter means having first and second terminals and tunable with the capacitance of said varactor diode to reject said third frequency signals, tuned circuit means for coupling an input signal of said first frequency to the first terminal of said first anti-resonant filter means, means coupling the second terminal of said first anti-resonant filter means to said first diode electrode, second anti-resonant filter means having first and second terminals and tuned to reject said first frequency signal, means including amplification means for coupling pump frequency signals of said second frequency to the first terminal of said second anti-resonant filter means, means connecting the second terminal of said second anti-resonant filter means to the first terminal of said first anti-resonant filter means, inductor means coupling the second terminal of said second filter means to a reference potential, reactance means coupling the first terminal of said second anti-resonant filter means to said reference potential, with said inductor means and said reactance means resonant with the capacitance of said diode at said pumping frequency, means coupling said second diode electrode to said reference potential, means for applying a bias potential to said second diode terminal, and circuit means tuned to said third frequency coupled to said first diode electrode to provide an output signal.

7. A parametric down-converter for combining an input signal of a first frequency with a pump signal of a second frequency to provide an output signal of a third frequency, which third frequency is the difference between said pumping signal frequency and said input signal frequency, said down-converter including in combination, a varactor diode having first and second electrodes, first anti-resonant filter means having first and second terminals and tunable with the capacitance of said varactor diode to reject said third frequency signals, means for coupling input signals of said first frequency to the first terminal of said first anti-resonant filter means, means coupling the second terminal of said first anti-resonant filter means to said first diode electrode, a second anti-resonant filter means having first and second terminals and tuned to reject said input frequency signal, means including amplification means for coupling pumping signals of said third frequency to the first terminal of said second anti-resonant filter means, means connecting the second terminal of said second anti-resonant filter means to the first terminal of said first anti-resonant filter means, inductor means coupling the second terminal of said second anti-resonant filter means to a reference potential, reactance means coupling the first terminal of said second anti-resonant filter means to said reference potential, with said inductor means and said reactance means resonant with the capacitance of said diode at said third frequency, means coupling said second diode electrode to said reference potential, means for applying a bias potential to said second diode electrode, means presenting a high impedance to said pump signals and said input signals for coupling said first diode electrode to circuit means tuned to said third frequency to provide an output signal, means for applying a bias potential to said second diode electrode, and resistor means connecting said first diode electrode to said reference potential.

8. In a superheterodyne receiver having radio frequency stages, intermediate frequency stages, and means for converting received carrier wave signals in the radio frequency stage to an intermediate frequency, which receiver is productive of spurious response resulting from signals of an unwanted frequency being coupled to said radio frequency stages to be converted to modulation products which may fall within the pass band of said intermediate frequency stages, the improvement comprising a varactor diode having first and second electrodes, antiresonant filter means for rejecting signals of intermediate frequency and having an input terminal and an output terminal connected to said first diode electrode, tuned circuit means coupling radio frequency signals to said input terminal, a pump oscillator, tuned circuit means for coupling the output of said pump oscillator to said input terminal, filtering means coupling said first diode electrode to said intermediate frequency stages of said receiver, resistor means connecting said first diode electrode to a reference potential, and means for applying biasing voltage to said second diode electrode, whereby said biasing voltage provides operation of said varactor diode in a given non-linear region of its voltage capacitance curve and the level of the pumping signal applied to said first diode electrode improves the intermodulation protection characteristic of said diode.

References Cited

UNITED STATES PATENTS 3,195,062 7/1965 Murakami ---------- 330—4.9

KATHLEEN H. CLAFFY, *Primary Examiner.*

R. S. BELL, *Assistant Examiner.*